United States Patent [19]
Yako et al.

[11] Patent Number: 6,040,112
[45] Date of Patent: Mar. 21, 2000

[54] PHOTORESIST COMPOSITION

[75] Inventors: Yuko Yako, Takatsuki; Kenji Takahashi, Osaka; Hiroshi Takagaki, Higashiosaka; Nobuhito Fukui, Toyonaka, all of Japan

[73] Assignee: Sumitomo Chemical Company, Limited, Osaka, Japan

[21] Appl. No.: 09/083,436

[22] Filed: May 22, 1998

[30]       Foreign Application Priority Data

May 26, 1997   [JP]   Japan ..................................... 9-135254

[51] Int. Cl.$^7$ ...................................................... G03F 7/004
[52] U.S. Cl. ........................................ 430/270.1; 430/905
[58] Field of Search ................................. 430/270.1, 905

[56]            References Cited

U.S. PATENT DOCUMENTS

| | | | |
|---|---|---|---|
| 5,556,734 | 9/1996 | Tamachika et al. .................. | 430/270.1 |
| 5,580,695 | 12/1996 | Murata et al. ........................ | 430/270.1 |
| 5,658,706 | 8/1997 | Niki et al. ............................. | 430/270.1 |
| 5,683,856 | 11/1997 | Aoai et al. ............................ | 430/270.1 |
| 5,693,452 | 12/1997 | Aoai et al. ............................ | 430/270.1 |
| 5,750,309 | 5/1998 | Hatakeyama et al. .................. | 430/170 |

FOREIGN PATENT DOCUMENTS

| | | |
|---|---|---|
| 0660187 A1 | 6/1995 | European Pat. Off. . |
| 0708368 A1 | 4/1996 | European Pat. Off. . |
| 0837368 A1 | 4/1998 | European Pat. Off. . |

*Primary Examiner*—John S. Chu
*Attorney, Agent, or Firm*—Birch, Stewart, Kolasch & Birch, LLP

[57]            ABSTRACT

A chemical amplifying type positive photoresist composition, excellent in various properties such as film retention ratio, applicability, heat resistance, sensitivity, resolution, profile and time delay resistance, and not easily affected by environment, which comprises (A) a resin which is converted to alkali-soluble by the action of an acid, (B) an acid generator and (C) a tertiary amine compound having an ether bond; and a fine photoresist pattern can be formed in high precision using the photoresist composition.

2 Claims, No Drawings

PHOTORESIST COMPOSITION

BACKGROUND OF THE INVENTION

The present invention relates to a photoresist composition suitable for lithography utilizing high-energy radiation such as a far ultraviolet ray including eximer laser, electron beam, X-ray, radiation or the like.

Recently, with development of higher integration of an integrated circuit, formation of a submicron pattern is required. Eximer laser lithography has attracted special interest for such a requirement, particularly for it enables production of 64 MDRAM and 256 MDRAM. As a resist suitable for such eximer laser lithography process, a so-called chemical amplifying type resist has been suggested which utilizes an acid catalyst and chemical amplifying effect. In the chemical amplifying type resist, solubility of portion irradiated with a radiation in an alkaline developer is changed through a reaction utilizing an acid catalyst generated from an acid generator in the irradiated portion, and by this, a positive or negative pattern is obtained.

In the chemical amplifying type positive resist, an acid generated in the irradiated portion diffuses by post heat treatment (post exposure bake: hereinafter, abbreviated as PEB), and acts as a catalyst for changing solubility of irradiated portion in a developer. Such a chemical amplifying type resist has a defect that it is liable to be influenced by the environment. For example, it is known that performances thereof change depending on the standing time from irradiation to PEB, which is referred to time delay effect. The time delay effect not only decreases the resolution but also generates a layer poorly soluble in an alkaline developer on the surface of a resist film and lowers the size reproducibility of pattern by making pattern after the developing in T shape. It is said that the time delay effect is caused by deactivation of an acid generated in a resist by a small amount of ammonia or amines existing in environmental atmosphere.

To suppress such a time delay effect, namely to increase time delay effect resistance (hereinafter, abbreviated as TDE resistance), it is known to added a nitrogen-containing compound to a chemical amplifying type positive resist as a quencher. By this addition, TDE resistance increases to a certain extent. However, the increase in TDE resistance and resolution are not sufficient when a conventionally known nitrogen-containing compound is used as a quencher.

SUMMARY OF THE INVENTION

The object of the present invention is to provide a chemical amplifying type positive photoresist composition excellent in various properties such as film retention ratio, applicability and heat resistance, particularly excellent in sensitivity, resolution, profile and TDE resistance. The present inventors have intensely studied for attaining such object and, as a result, found that a positive photoresist composition having excellent performances is obtained by using a specific compound as a quencher. The present invention was thus completed.

The present invention provides a positive photoresist composition comprising (A) a resin which is converted to alkali-soluble from alkali-insoluble or alkali slightly soluble by the action of an acid, (B) an acid generator and (C) a tertiary amine compound having an ether bond. By addition of the tertiary amine compound having an ether bond to the photoresist composition, particularly sensitivity, resolution, profile, TDE resistance and the like are improved.

The resin (A) which is a main component of the photoresist component is by itself alkali-insoluble or alkali slightly soluble, and becomes alkali soluble by a chemical reaction caused by the action of an acid. For example, there is used a resin obtained by protecting at least a part of a phenolic hydroxyl group in an alkali soluble resin having a phenol skeleton with a group which has solution inhibiting ability against alkaline developers and is insecure against acid.

Examples of the alkali soluble resin used for producing the resin (A) include novolak resins, polyvinylphenol resins, polyisopropenylphenol resins, copolymers of vinylphenol with styrene, acrylonitrile, methyl methacrylate or methyl acrylate, and copolymers of isopropenylphenol with styrene, acrylonitrile, methyl methacrylate or methyl acrylate. Positional relation between a hydroxy group and a vinyl group or an isopropenyl group in vinylphenol and isopropenylphenol is not particularly limited, however, in general, p-vinylphenol or p-isopropenylphenol is preferred. Hydrogen may also be added to these resins for improving transparency. An alkyl group, alkoxy group and the like may be introduced into a phenol nucleus of the above-described resins, as long as the resulting resin is alkali-soluble. Among these alkali soluble resins, polyvinylphenol-based resins, namely a homopolymer of vinylphenol or copolymer of vinylphenol with other monomer are preferably used.

The group to be introduced in the alkali soluble resin which has solution inhibiting ability against an alkali developer and is insecure against acid can be selected from various known protecting groups. Examples thereof include a tert-butoxycarbonyl group, tert-butoxycarbonylmethyl group, tetrahydro-2-pyranyl group, tetrahydro-2-furyl group, methoxymethyl group and 1-ethoxyethyl group. These groups shall be substituted for hydrogen on a phenolic hydroxyl group. Among these protecting groups, particularly, 1-ethoxyethyl group is preferred. The ratio of the phenolic hydroxyl groups substituted by the protecting group to the all phenolic hydroxyl groups in the alkali soluble resin (protective group introducing ratio) is preferably from 10 to 50%, in general.

It is preferred that the resin (A) comprises a resin obtained by protecting a phenolic hydroxyl group in the above-described polyvinylphenol-based resin with a group which has solution inhibiting ability against an alkali developer and is insecure against acid. Among them, particularly preferred is a resin obtained by partially protecting a phenolic hydroxyl group in the polyvinylphenol-based resin with a 1-ethoxyethyl group.

The acid generator (B) can be selected from various compounds which generate an acid by irradiation to the substance itself or a resist composition containing the substance. The acid generator (B) can be used as a mixture of two or more compounds. Examples thereof include onium salts, organic halogen compounds, compounds having a diazomethanedisulfonyl skeleton, disulfone compounds having an aromatic group, orthoquinone diazide compounds and sulfonic acid compounds. In the present invention, as the acid-generator, compounds having a diazomethanedisulfonyl skeleton are preferably used. Examples of the compounds having a diazomethanedisulfonyl skeleton as the acid generator include bis(benzenesulfonyl)diazomethane, bis(4-chlorobenzenesulfonyl)diazomethane, bis(p-toluenesulfonyl)diazomethane, bis(4-tert-butylbenzenesulfonyl)diazomethane, bis(2,4-xylenesulfonyl)diazomethane and bis(cyclohexanesulfonyl) diazomethane.

In addition to the above-described resin (A) and the acid generator (B), the photoresist composition of the present invention comprises (C) a tertiary amine compound having an ether bond as a quencher. It is preferable that the tertiary amine compound (C) is a compound which does not vaporizes at pre-baking temperature, so that it remains in a resist film formed on a substrate even after pre-baking of the resist film and exhibits effect. Therefore, in general, a compound having the boiling point of of 150° C. or higher is used as the tertiary amine compound (C).

The tertiary amine compound(C) may be any compounds which has a tertiary nitrogen atom and simultaneously an etherbond. It is preferable that the tertiary nitrogen atom and an oxygen atom of the ether bond are bonded through an aliphatic group. The other two groups bonded to the tertiary nitrogen atom and another group bonded to the oxygen atom may be selected from aliphatic groups, aromatic groups, aromatic aliphatic groups and the like. A tertiary amine compound having two or more ether bonds in the molecule may also be used. Examples of the tertiary amine compound having an ether bond (C) include a compound represented by the following formula (I):

wherein X represents a divalent aliphatic group, $R^1$, $R^2$ and $R^3$ represent each independently a monovalent aliphatic group, aromatic group or aromatic aliphatic group, provided that $R^1$ and $R^2$ may form a ring together with a nitrogen atom to which they bond, $R^1$ and a carbon atom in X may form a ring together with a nitrogen atom to which they bond, or $R^1$ and $R^3$ may form a ring together with —N—X—O—.

In the above-described formula (I), typical examples of the divalent aliphatic group represented by X include alkylene groups having about 1 to 6 carbon atoms, which may be optionally substituted by alkoxy, cycloalkoxy, aryloxy or the like.

Typical example of the monovalent aliphatic group represented by $R^1$, $R^2$ and $R^3$ include an alkyl group having about 1 to 6 carbon atoms. The monovalent aliphatic group may be cyclic group such as cyclohexyl. These alkyl and cycloalkyl group may be optionally substituted by alkoxy, alkoxyalkoxy, halogen or the like. Typical example of the monovalent aromatic group represented by $R^1$, $R^2$ and $R^3$ include a phenyl group, which may be optionally substituted with alkyl, halogen, nitro or the like. Typical example of the monovalent aromatic aliphatic group represented by $R^1$, $R^2$ and $R^3$ include benzyl, benzhydryl and trytyl. The benzene ring of the above-exemplified monovalent aromatic aliphatic group may be optionally substituted with a substituent such as those exemplified above.

When a ring is formed with $R^1$ and $R^2$ with a nitrogen atom which they bond or a ring is formed with $R^1$ and a carbon atom in X with a nitrogen atom which they bond, the ring may be a 5-membered ring such as a pyrrolidine, a 6-membered ring such as a piperidine ring and morpholine ring, or the like, and substituents such as alkyl, alkoxy and the like may bond to these ring. These rings may contain a second hetero atom, such as other nitrogen atom, oxygen atom, sulfur atom and the like, in addition to a nitrogen atom to which X, $R^1$ and $R^2$ bond. The ring formed with $R^1$ and $R^3$ may be, for example, a morpholine ring.

Examples of the tertiary amine compound having an ether bond (C) used in the present invention include tris[2-(2-methoxyethoxy)ethyl]amine, 2-(benzhydryloxy)-N,N-dimethylethylamine, 2,2-diethoxytriethylamine, 1,1-diethoxytrimethylamine, 1,1-dimethoxytrimethylamine, 1,1-dicyclohexyloxyltrimethylamine, 2,2,2',2'-tetraethoxy-N-methyldiethylamine, N-methylmorpholine, N-ethylmorpholine, N-isopropylmorpholine, N-benzylmorpholine, N-trytylmorpholine and N-[2-(p-nitrophenoxy)ethyl)morpholine.

The amount of the resin (A) is preferably from 20 to 99% by weight, more preferably from 50 to 99% by weight based on the weight of total solid component of this composition. The amount of the acid-generator (B) is preferably from 0.05 to 20% by weight, more preferably from 0.05 to 15% by weight, based on the weight of total solid component of this composition. The amount of the tertiary amine compound having an ether bond (C) is preferably from 0.001 to 10% by weight, more preferably from 0.001 to 3% by weight, based on the weight of total solid component of this composition. The photoresist composition of the present invention may optionally comprise other components, for example, various additives conventionally used in this field such as a dissolution inhibitor, sensitizers, dye, adhesion improver and electron donor.

A resist solution is prepared by mixing the above respective components with a solvent so that the concentration of the total solid content in this positive photoresist composition is within the range from 10 to 50% by weight. The solution is coated on a substrate such as silicon wafer. The solvent used may be any one which can dissolve the respective components and may be those which are normally used in this field. Examples thereof include glycol ether esters such as ethylcellosolve acetate, methylcellosolve acetate, propylene glycol monomethyl ether acetate and propylene glycol monoethyl ether acetate, glycol mono or diethers such as ethylcellosolve, methylcellosolve, propylene glycol monometyl ether, propylene glycol monoethyl ether and diethylene glycol dimethyl ether, esters such as ethyl lactate, butyl lactate and ethyl pyruvate, ketones such as 2-heptanone, cyclohexanone and methyl isobutyl ketone, and aromatic hydrocarbons such as xylene. These solvents may be used alone or in combination of two or more.

A positive pattern is formed from the resist film coated on a substrate, usually via respective processes such as pre-baking, patterning exposure, PEB, developing with an alkali developer.

The following example further illustrates the present invention in detail, but does not limit the scope thereof. In example, reference example and comparative example, all "part" or "parts" is by weight unless otherwise stated.

REFERENCE EXAMPLE

Protection of Resin

Into a nitrogen-purged 500 ml four-necked flask were charged 25 g (208 mmol in terms of p-vinylphenol unit) of poly(p-vinylphenol) having a weight average molecular eight (Mw) of 23,900 and a polydispersion (Mw/Mn) of 1.12 [VP-15000 manufactured by Nippon Soda Co., Ltd.) and 0.021 g(0.109 mmol) of p-toluenesulfonic acid, and they were dissolved in 250 g of 1,4-dioxane. To this solution was added dropwise 7.88 g (109 mmol) of ethylvinyl ether, then, the mixture was reacted at 25° C. for 5 hours. Thereafter, the reaction solution was added dropwise into 1500 ml of ion-exchanged water, then filtered to obtain a white wet cake. This wet cake was again dissolved into 200 g of 1,4-dioxane, then the solution was added dropwise to 1500 ml of ion-exchanged water, and filtered. The resulted wet cake was washed by stirring in 600 g of ion-exchanged water, and filtered to take a wet cake. Thereafter, this washing operation using this ion-exchanged water was repeated twice. The resulted white wet cake was dried under reduced pressure to obtain a resin in which a hydroxyl group of poly(p-vinylphenol) was partially 1-ethoxyethyl etherified. This resin was analyzed by $^1$H-NMR to find that 35% of the hydroxy group was protected by a 1-ethoxyethyl group. This resin had a weight average molecular weight of 31,200 and a polydispersion of 1.17.

EXAMPLE 13.5 parts of the resin synthesized in Reference Example, 0.5 parts of bis (cyclohexanesufonyl) diazomethane as an acid generator and 0.015 parts of tris[2-(2-methoxyethoxy)ethyl]amine were dissolved in 67 parts of propylene glycol monomethyl ether acetate. The resulted solution was filtrated through a filter made of a fluorine resin having a pour size of 0.1 µm to prepare a resist solution.

On a silicone wafer washed by a conventional method, the resist solution thus obtained was coated using a spin coater so that the thickness after drying was 0.7 µm. Then, this silicone wafer was pre-baked at 90° C. for 90 seconds on a hot plate. The film after the pre-baking was subjected to exposure treatment using KrF eximer laser stepper having an exposure wavelength of 248 nm [NSR-1755 EXBA manufactured by Nikon Corp., NA=0.45) with changing exposure amount stepwise, through a chromium mask having a pattern. Immediately, or after left for 30 minutes in a clean room having an ammonia concentration of 2 to 3 ppb, the wafer after the exposure was heated for 90 seconds at 100° C. on a hot plate for conducting PEB to effect de-protective group reaction in the exposed portion. This was developed with 2.38% by weight aqueous solution of tetramethylaminium hydroxide to obtain a positive pattern.

The pattern thus formed was observed by an electron microscope. The sample obtained in the case PEB was conducted immediately after the exposure resolved a fine pattern of 0.24 µm in good profile at an exposure of 32 mJ/cm$^2$. Likewise, the sample obtained in the case PEB was conducted after left for 30 minutes after the exposure resolved a fine pattern in good profile.

COMPARATIVE EXAMPLE

The same procedure as in Example was conducted except that 0.015 parts of tris[2-(2-methoxyethoxy)ethyl]amine was substituted by 0.02 parts of aniline. As a result, even if PEB was conducted immediately after the exposure, only a pattern of 0.30 µm was resolved with an exposure of 103 mJ/cm$^2$.

The photoresist composition according to the present invention which comprises a tertiary amine compound having an ether bond is not easily affected by environmental circumstance, and excellent in sensitivity, resolution and profile, and by using this composition, a fine photoresist pattern can be formed in high precision.

What is claimed is:

1. A positive photoresist composition comprising (A) a resin which is converted to alkali-soluble from alkali-insoluble or alkali slightly soluble by the action of an acid and contains a resin obtained by partially protecting a phenolic hydroxyl group in a polyvinylphenol resin with a 1-ethoxyethyl group, (B) a diazomethanedisulfonyl compound as an acid generator and (C) a tertiary amine compound (having an ether bond) represented by the following formula (I):

$$R^1R^2N-X-OR^3 \tag{I}$$

Wherein x represents a divalent aliphatic group, $R^1$, $R^2$ and $R^3$ represent each independently a monovalent aliphatic group, aromatic group or aromatic aliphatic group, provided that $R^1$ and $R^2$ form a ring together with a nitrogen atom to which they bond, $R^1$ and a carbon atom in X form a ring together with a nitrogen atom to which they bond, or $R^1$ and $R^3$ form a ring together with —N—X—O—.

2. The composition according to claim 1, wherein the amount of the resin (A) is from 20 to 99% by weight, the amount of the acid-generator (B) is from 0.05 to 20% by weight, and the amount of the tertiary amine compound (C) is from 0.001 to 10% by weight, based on the total solid component weight of the composition.

* * * * *